US007932756B2

(12) United States Patent  (10) Patent No.: US 7,932,756 B2
Heragu et al.  (45) Date of Patent: Apr. 26, 2011

(54) MASTER SLAVE DELAY LOCKED LOOPS AND USES THEREOF

(75) Inventors: Keerthinarayan P. Heragu, Richardson, TX (US); Padattil K. Nisha, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 28 days.

(21) Appl. No.: 11/832,036

(22) Filed: Aug. 1, 2007

(65) Prior Publication Data

US 2009/0033387 A1 Feb. 5, 2009

(51) Int. Cl.
H03L 7/06 (2006.01)
(52) U.S. Cl. ........................ 327/158; 327/149
(58) Field of Classification Search .................. 327/158, 327/161
See application file for complete search history.

(56) References Cited

U.S. PATENT DOCUMENTS

| 5,515,403 | A  | * | 5/1996  | Sloan et al. ............... 375/371 |
| 6,400,197 | B2 | * | 6/2002  | Lai et al. .................. 327/161 |
| 6,452,431 | B1 | * | 9/2002  | Waldrop .................... 327/158 |
| 6,850,107 | B2 | * | 2/2005  | Gomm ........................ 327/277 |
| 7,075,285 | B2 | * | 7/2006  | Chin ......................... 324/76.54 |
| 7,206,369 | B2 | * | 4/2007  | Findley et al. ............ 375/373 |
| 7,423,468 | B2 | * | 9/2008  | Cho ........................... 327/175 |
| 7,495,487 | B2 | * | 2/2009  | Ma et al. ................... 327/158 |
| 7,668,679 | B2 | * | 2/2010  | Best ........................... 702/106 |
| 7,671,648 | B2 | * | 3/2010  | Kwak ......................... 327/158 |
| 2005/0083099 | A1 | * | 4/2005  | Lin .............................. 327/295 |
| 2005/0105349 | A1 | * | 5/2005  | Dahlberg et al. ............. 365/201 |
| 2005/0253572 | A1 | * | 11/2005 | Chin .......................... 324/76.54 |
| 2007/0132497 | A1 | * | 6/2007  | Chae .......................... 327/285 |
| 2007/0237010 | A1 | * | 10/2007 | Hong et al. .................. 365/193 |
| 2009/0238017 | A1 | * | 9/2009  | Wakasa ....................... 365/194 |

OTHER PUBLICATIONS

U.S. Appl. No. 11/832,021, filed Aug. 1, 2007, Heragu.
U.S. Appl. No. 11/832,030, filed Aug. 1, 2007, Nisha.
U.S. Appl. No. 11/832,045, filed Aug. 1, 2007, Heragu.

* cited by examiner

*Primary Examiner* — Thomas J Hiltunen
(74) *Attorney, Agent, or Firm* — Dawn V. Stephens; Wade James Brady, III; Frederick J. Telecky, Jr.

(57) ABSTRACT

Various systems and methods for delaying a signal relative to another signal are disclosed. As one example, a delay lock loop circuit is disclosed that includes at least two delay stages. Each of the aforementioned delay stages include a plurality of selectable delay elements. Such selectable delay elements may be, but are not limited to, a plurality of single input buffers, and a plurality of multiple input logic gates. Further, a first of the delay stages is selectably driven by one of a first signal and a reference signal, and the stage provides a first stage output. A second of the delay stages is selectably driven by one of a second signal and the first stage output, and the stage provides a second stage output. The circuit further includes a mode signal that has at least two states. One of the two states causes the first signal to drive the first delay stage and the second signal to drive the second delay stage, and the other state causes the reference signal to drive the first delay stage and the first stage output to drive the second delay stage. In some cases, the first state is referred to as a slave state and the second state is referred to as a master state. In addition, the circuit includes a feedback loop.

10 Claims, 11 Drawing Sheets

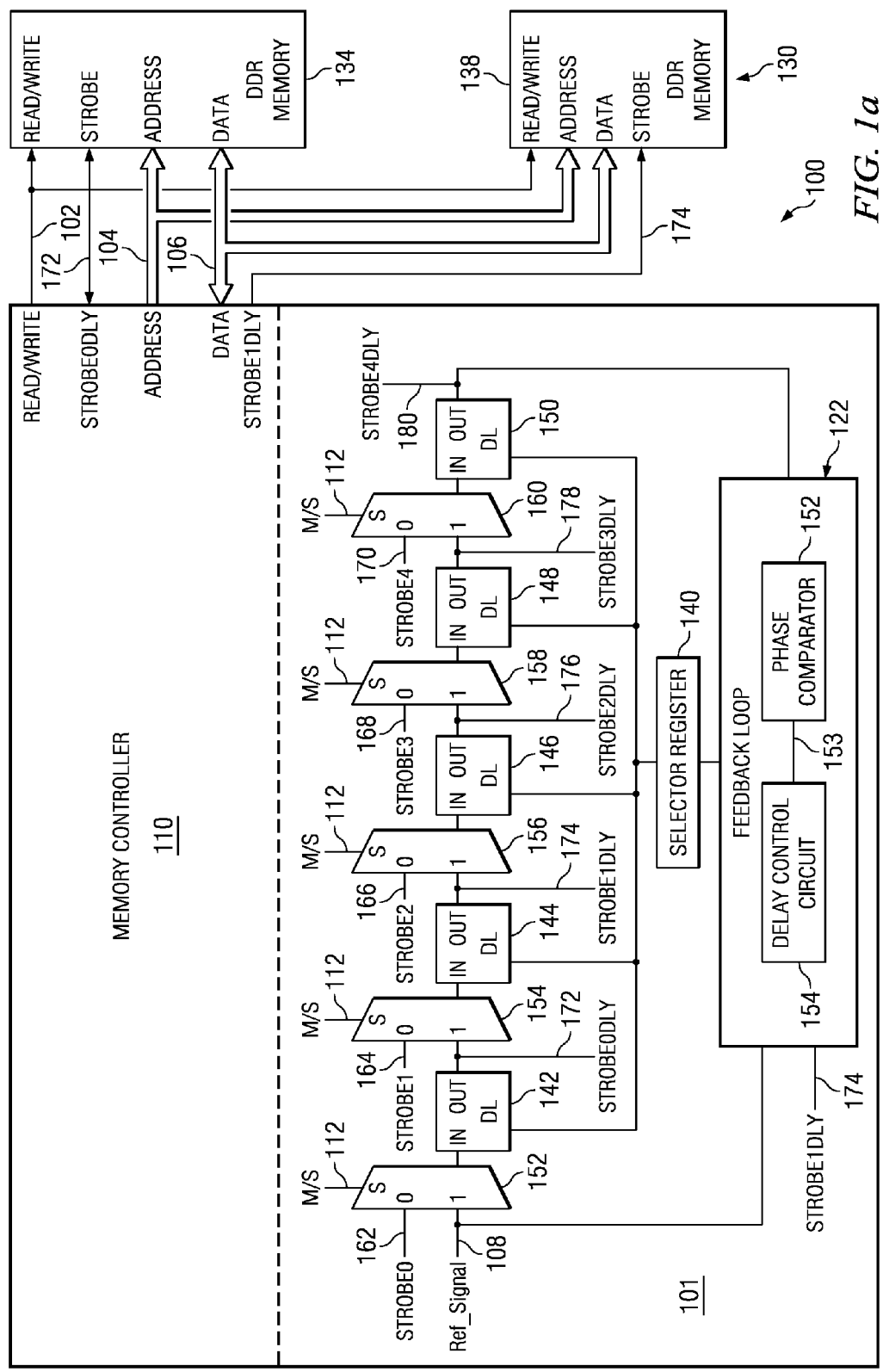

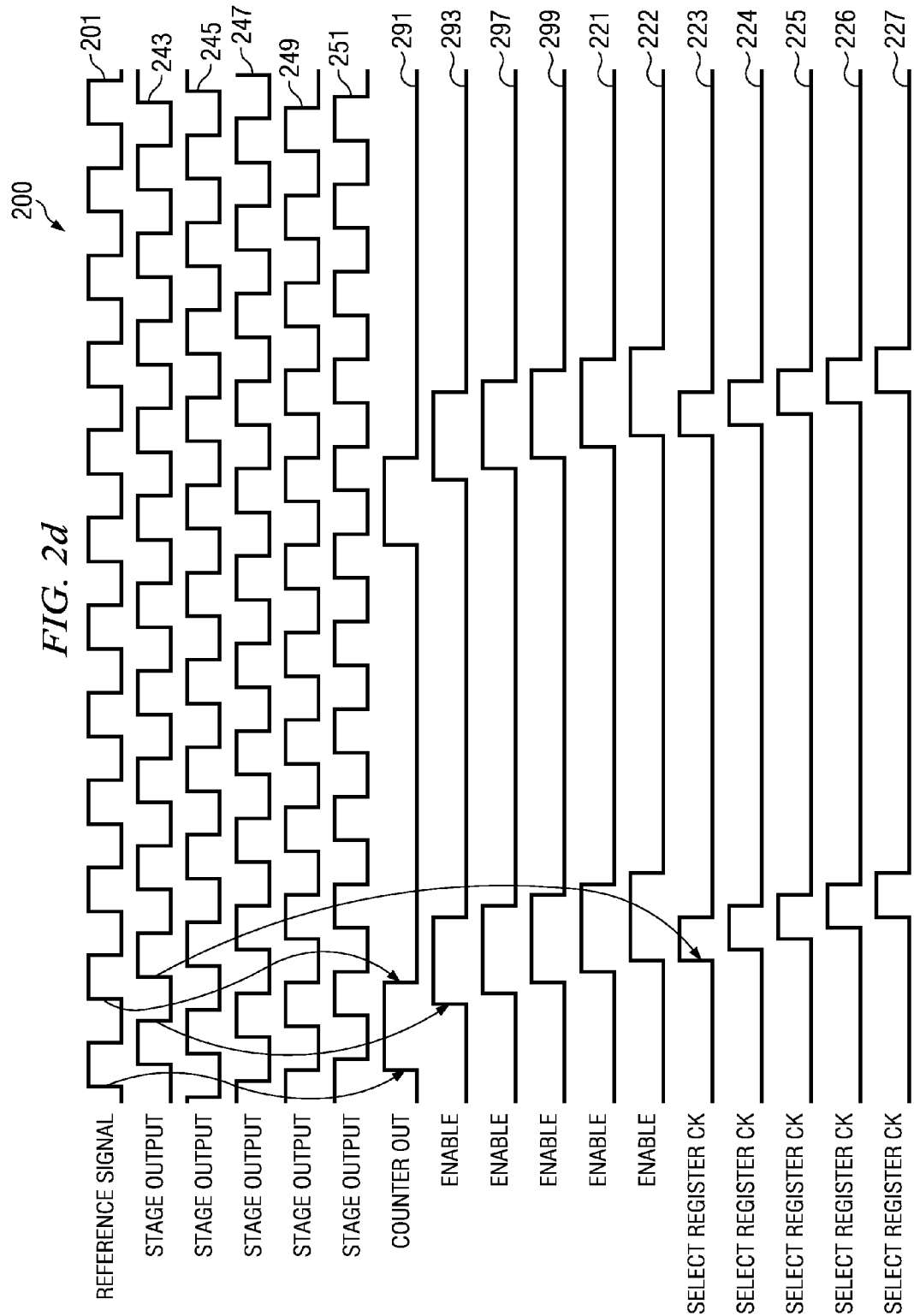

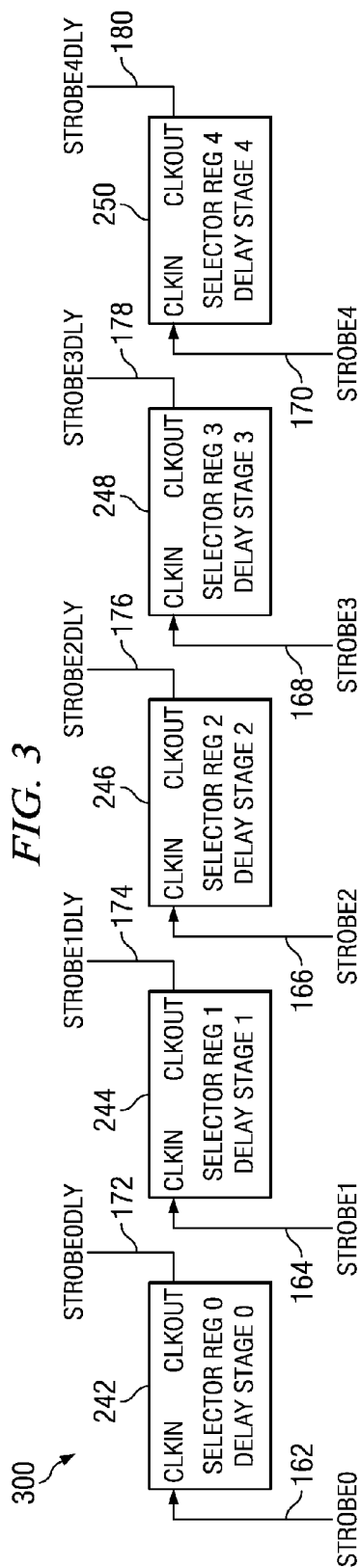
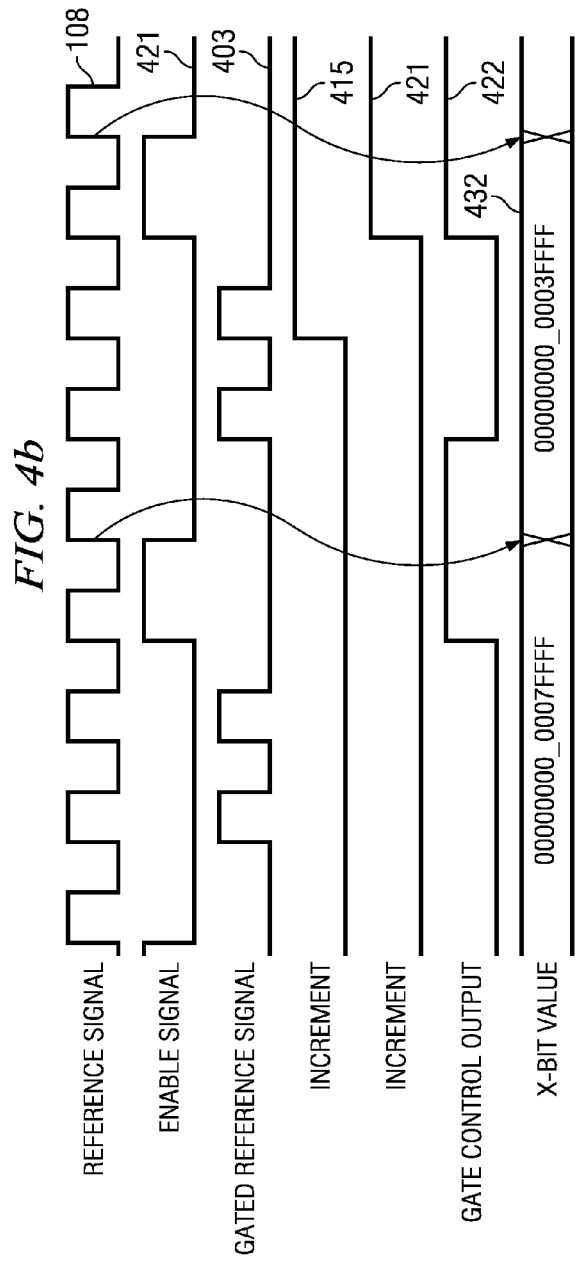

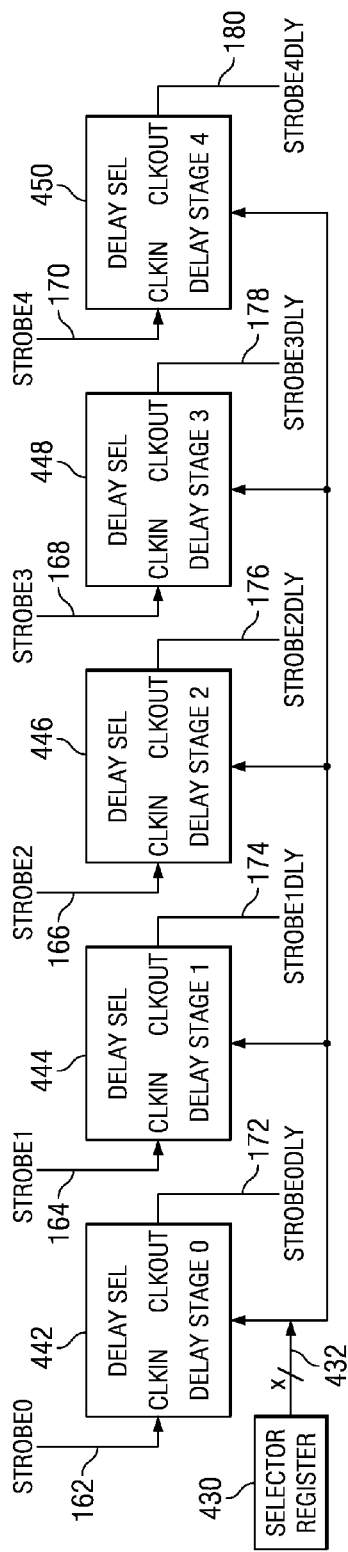
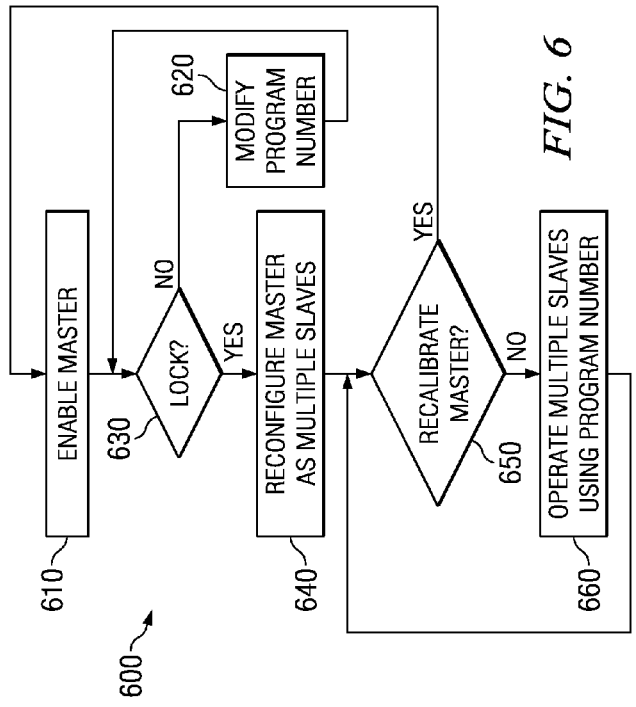
FIG. 5
FIG. 6

MASTER SLAVE DELAY LOCKED LOOPS AND USES THEREOF

BACKGROUND OF THE INVENTION

The present invention is related to event synchronization, and more particularly to systems and methods for synchronizing one signal to another signal in a semiconductor device.

Synchronizing one electrical signal to another often involves applying the signal to a data input of a flip-flop, and clocking the flip-flop using a clock to which the signal is to be synchronized. The signal to be synchronized generally must be applied to the data input of the flip-flop for a defined period before the clock transitions (i.e., setup time), and must remain for a defined period after the clock transitions (i.e., hold time). By assuring that the setup and hold times are met, predictable circuit operation is achieved.

In some cases, a delay lock loop circuit has been used to delay a signal in relation to a synchronizing clock to assure that setup and hold times are met. Such delay lock loops may be iteratively updated until a desired delay is achieved. Implementation of such a delay lock loop typically requires substantial circuitry and a corresponding amount of chip area. This leads to increased chip costs and in some cases reduced yield.

Thus, for at least the aforementioned reasons, there exists a need in the art for advanced systems and devices for implementing a signal delay.

BRIEF SUMMARY OF THE INVENTION

The present invention is related to event synchronization, and more particularly to systems and methods for synchronizing one signal to another signal in a semiconductor device.

Various embodiments of the present invention provide delay lock loop circuits that include at least two delay stages. Each of the aforementioned delay stages include a plurality of selectable delay elements. Such selectable delay elements may be, but are not limited to, a plurality of single input buffers, and a plurality of multiple input logic gates. Further, a first of the delay stages is selectably driven by one of a first signal and a reference signal, and the stage provides a first stage output. A second of the delay stages is selectably driven by one of a second signal and the first stage output, and the stage provides a second stage output. The circuit further includes a mode signal that has at least two states. One of the two states causes the first signal to drive the first delay stage and the second signal to drive the second delay stage, and the other state causes the reference signal to drive the first delay stage and the first stage output to drive the second delay stage. In some cases, the first state is referred to as a slave state and the second state is referred to as a master state. In addition, the circuit includes a feedback loop.

The reference signal and a derivative of the second stage output are provided as inputs to the feedback loop, and the feedback loop is operable at least when the mode signal is in the second state to determine a program number corresponding to a number of the plurality of selectable delay elements utilized in the first delay stage and the second delay stage to delay the derivative of the second stage output relative to the reference signal. In some cases, the derivative of the second stage output may be, for example, the second stage output, or the second stage output after being delayed by one or more additional delay stages. The circuit further includes a selection register that is communicably coupled to both the first delay stage and the second delay stage. A value stored in the selection register corresponds to the program number, and the value determines the number of the plurality of selectable delay elements utilized to delay the first stage output relative to the input of the first delay stage, and to delay the second stage output relative to the input of the second stage.

In some instances of the aforementioned embodiments, the feedback loop is only operable to determine the program number when the mode signal is in the second state. In various instances, the feedback loop includes an increment/decrement circuit that is operable to modify the value in the selection register based on a comparison of the reference signal with the derivative of the second stage output. In some instances of the aforementioned embodiments, the first delay stage and the second delay stage are substantially identical.

In some instances of the aforementioned embodiments, the circuit further includes a third delay stage, a fourth delay stage and a fifth delay stage. Each of the aforementioned delay stages includes the plurality of selectable delay elements. In such cases, the derivative of the second stage output may be, for example, an output of the fourth delay stage or an output of the fifth delay stage.

Other embodiments of the present invention provide methods for delay signal timing. Such methods include providing a delay lock loop circuit that includes at least a first delay stage and a second delay stage. Each of the first delay stage and the second delay stage includes a plurality of selectable delay elements. The delay lock loop circuit is operated in a first mode where the first delay stage and the second delay stage are configured in series with a reference signal applied to an input of the first delay stage, and an output of the first delay stage is applied as an input to the second delay stage. A number of the selectable delay elements is determined that when configured in series implement a particular delay, and the determined number is provided to both the first delay stage and the second delay stage. The delay lock loop circuit is operated in a second mode where a first signal is applied to the input of the first delay stage, and the first delay stage provides a first output delayed relative to the first signal by an amount corresponding to the determined number of the selectable delay elements. Further, a second signal is applied to the input of the second delay stage, and the second delay stage provides a second output delayed relative to the second signal by an amount corresponding to the determined number of the selectable delay elements.

Yet another embodiment of the present invention provide methods for delay signal timing. Such methods include providing a delay lock loop circuit that includes at least a first delay stage and a second delay stage. Each of the first delay stage and the second delay stage includes a first plurality of selectable delay elements. The delay lock loop circuit is operated with the first delay stage and the second delay stage configured in series with a reference signal applied to an input of the first delay stage, and an output of the first delay stage is applied as an input to the second delay stage. A number of the first plurality of delay elements is determined that when configured in series implement a particular delay. The methods further include providing a third delay stage that includes a second plurality of selectable delay elements. An input is applied to the third delay stage, and the third delay stage provides an output signal. A number of the second plurality of selectable delay elements is selected with the selected number corresponding to the determined number of the first plurality of delay elements. The selected number of the second plurality of delay elements are configured in series such that the output signal is the input signal delayed by a time period corresponding to the determined number of the first plurality of delay elements. In some cases, this may be implemented with a common delay flip-flop or separate delay flip-flops.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 1a shows a memory system that utilizes a combination memory controller and delay lock loop circuit in accordance with one or more embodiments of the present invention;

FIG. 1b depicts a strobe signal delayed in relation to a data signal;

FIGS. 2a-2f show an exemplary delay lock loop circuit representing operation of the delay lock loop circuit of FIG. 1a when operated in master mode in accordance with some embodiments of the present invention;

FIG. 3 depicts an exemplary slave configured delay circuit representing operation of the delay lock loop circuit of FIG. 1a when operated in slave mode using the exemplary circuits described in relation to FIG. 2 in accordance with some embodiments of the present invention;

FIGS. 4a-4e show another exemplary delay lock loop circuit representing operation of the delay lock loop circuit of FIG. 1a when operated in master mode in accordance with various embodiments of the present invention;

FIG. 5 depicts another exemplary slave configured delay circuit representing operation of the delay lock loop circuit of FIG. 1a when operated in slave mode using the exemplary circuits described in relation to FIG. 4 in accordance with some embodiments of the present invention; and FIG. 6 is a flow diagram depicting a method for implementing signal delay in accordance with various embodiments of the present invention.

DETAILED DESCRIPTION OF THE INVENTION

Figures 1B, 2A:
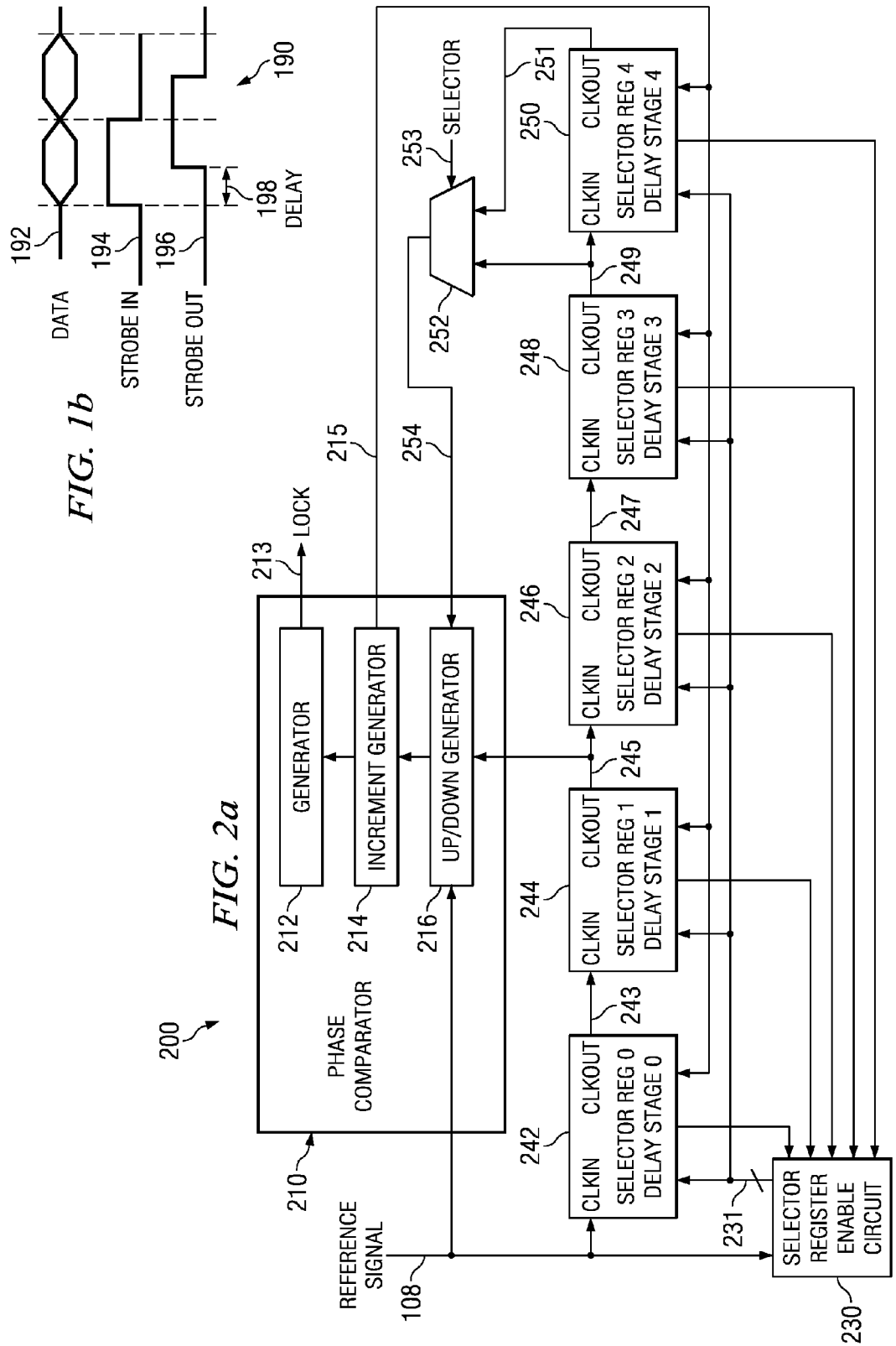

The present invention is related to event synchronization, and more particularly to systems and methods for synchronizing one signal to another signal in a semiconductor device.

Turning to FIG. 1a, a memory system 100 is shown that utilizes a combination memory controller 110 and a master/slave delay lock loop circuit 101 in accordance with one or more embodiments of the present invention. It should be noted that master/slave delay lock loop circuit 101 may be implemented on the same semiconductor die as memory controller 110, or may be implemented on a different die. Further, it should be noted that master/slave delay lock loop circuit 101 may be integrated with memory controller 110 or may be implemented as separate modules of the same circuit design. As shown, memory controller 110 includes a number of signals that are generated to allow access to one or more memory modules. Generation of such signals may be accomplished in various ways as are known in the art. For example, the same strobe signal may be used for both read and write signals, or a strobe signal for the read and a strobe signal for the write may be created internal to memory controller 110 and only at the interface of memory controller 110 are the two signals combined to drive the strobe I/O of the external memory. As shown, memory system 100 includes a bank 130 of double data rate memory blocks 134, 138. It should be noted that other memory types may be used in accordance with different embodiments of the present invention. Each of memory blocks 134, 138 includes an interface consisting of an address bus 104, a data bus 106, a strobe (a respective one of strobe0dly 172 and strobe1dly 174) and a read/write control line 102. In operation, when data is to be written to memory block 134, the appropriate address is applied to the address bus, the read/write control line is asserted to indicate a write operation, data is placed on the data bus, and the strobe signal for memory block 134 (i.e., strobe0dly 172) is asserted. The same process is done to write data to memory block 138, except that the strobe signal for memory block 138 (i.e., strobe1dly 174) is asserted. In contrast, when data is to be read from memory block 134, the appropriate address is applied to the address bus, the read/write control line is asserted to indicate a read operation. Memory block 134 then asserts the strobe associated memory block 134 (i.e., strobe0dly 172) coincident with applying data to the data bus. The same process is used for reading data from memory block 138, except that the strobe associated with memory block 138 (i.e., strobe1dly 174) is asserted. Based on the disclosure provided herein, one of ordinary skill in the art will recognize a variety of interfaces or signal sets that may be used in accordance with different embodiments of the present invention.

In some cases, the strobe and the data are not properly aligned during the read and write cycles. In such cases, master/slave delay lock loop circuit 101 may be used in slave mode to delay one or more strobe signals to create the appropriate alignment. As shown, each of delay stages 142, 144, 146, 148, 150 is used to delay a number of individual strobes when master/slave delay lock loop is operated in slave mode. The amount of delay applied by each of delay stages 142, 144, 146, 148, 150 corresponds to a delay time established when the aforementioned delay stages are operated in a master mode. While delay lock loop circuit 101 is shown in relation to a memory system, based on the disclosure provided herein, one of ordinary skill in the art will recognize a variety of applications that may benefit from use of such a delay lock loop circuit.

The aforementioned process of delaying strobes using any two of delay stages 142, 144, 146, 148, 150 is graphically displayed in FIG. 1b. Turning to FIG. 1b, a timing diagram 190 shows data 192 applied to the aforementioned data bus and a corresponding strobe in 194. As shown, strobe in 194 transitions coincident with the change in data 192. In some cases such an immediate transition results in a setup or hold problem in either memory blocks 134, 138 or a device receiving data from memory blocks 134, 138. By introducing a controlled time delay 198 to strobe in 194, any setup or hold problems may be averted. As more fully discussed below, time delay 198 is programmable by selecting a different number of delay elements implemented as part of delay stages 142, 144, 146, 148, 150.

Master/slave delay lock loop circuit 101 may be operated at alternate intervals in master and slave modes. In master mode, the '1' input of multiplexers 152, 154, 156, 158, 160 is selected using a master slave select 112. This selection causes a reference signal 108 to drive the input of delay stage 142. The output of delay stage 142 (i.e., strobe0dly 172) is the input of delay stage 144, the output of delay stage 144 (i.e., strobe1dly 174) is the input of delay stage 146, the output of delay stage 146 (i.e., strobe2dly 176) is the input of delay stage 148, and the output of delay stage 148 (i.e., strobe3dly 178) is the input of delay stage 150. The output of delay stage 150 is strobe4dly 180. The number of delay elements utilized in each of delay stages 142, 144, 146, 148, 150 is determined by a value maintained in a selector register 140. It should be noted that while a single selector register is used to feed a selection value into all of delay stages 142, 144, 146, 148, 150, in other embodiments of the present invention each delay stage may be associated with one particular selector register or two or more selector registers may each be associated with a subset of implemented delay stages.

In operation, the output of delay stage 150 (or in some cases, an output of one of the other delay stages 142, 144, 146, 148) is compared with reference signal 108 by a phase comparator 152. The output of phase comparator 152 indicates whether the number of delay elements currently utilized in each of delay stages 142, 144, 146, 148, 150 is to be incremented, decremented or left constant in order to achieve the desired delay lock. In particular, phase comparator 152 provides an increment/decrement signal 153 to a delay control circuit 154. Based on increment/decrement signal 153, delay control circuit 154 controls the value maintained in selector register 140, and thereby controls the number of delay elements used by each of delay stages 142, 144, 146, 148, 150. At some point, the output from delay stage 150 (or another of the delay stages) is at a desired delay and the delay lock loop is considered locked.

As just one of many examples, delay lock loop circuit 101 may be configured such that it locks when the output of delay stage 150 is phase delayed three hundred and sixty degrees from reference clock 122. It should be noted that phase delays other than ninety degrees may be achieved using one or more embodiments of the present invention. For example, a delay lock loop circuit may be configured to yield a seventy-two degree phase delay. As yet another example, a delay unrelated to phase shift, but rather an absolute time may be achieved. Based on the disclosure provided herein, one of ordinary skill in the art will recognize various delays that may be implemented using one or more embodiments of the present invention.

Once delay lock loop circuit 101 is locked, master slave select 112 is switched to select operation in slave mode. During operation in the slave mode, the value in selector register 140 that was established during operation in the master mode is maintained constant. Further, master slave select 112 is switched to select operation in slave mode. With master/slave select 112 thus set, a strobe0 162 drives the input of delay stage 142 via multiplexer 152, a strobe1 164 drives the input of delay stage 144 via multiplexer 154, strobe2 166 drives the input of delay stage 146 via multiplexer 156, strobe3 168 drives the input of delay stage 148 via multiplexer 158, and strobe4 170 drives the input of delay stage 150 via multiplexer 160. The value in selector register 140 established during operation in master mode controls the number of delay elements that are implemented in each of delay stages 142, 144, 146, 148, 150 during operation in slave mode. Thus, in slave mode where strobe0dly 172 is a delayed version of strobe0 162, the delay between strobe0dly 172 and strobe0 162 is controlled by the value in selector register 140 that was established during operation in the master mode. This similarly applies to the delay between the inputs of other delay stages and the output of the delay stages (i.e., the delay between strobe1dly 174 and strobe1 164, the delay between strobe2dly 176 and strobe2 166, the delay between strobe3dly 178 and strobe3 168, and the delay between strobe4dly 180 and strobe4 170). Each of the delayed strobe signals may be used in a slave mode to control one or more transactions such as, but not limited to, a memory data transfer.

Two different examples of delay lock loop circuit 101 when operating in master mode and a corresponding slave mode are depicted in FIGS. 2-3 and FIGS. 4-5 below. It should be noted that these examples are just two of many, and that based on the disclosure provided herein, one of ordinary skill in the art will recognize a number of different configurations of a delay lock loop circuit selectable to reuse individual delay stages in a slave mode are possible in accordance with different embodiments of the present invention.

Turning to FIGS. 2a-2f, an exemplary delay lock loop circuit 200 representing operation of the delay lock loop circuit of FIG. 1a when operated in master mode in accordance with some embodiments of the present invention is shown. It should be noted that exemplary delay lock loop circuit 200 includes selector registers integrated with each of the delay stages. In such a case, the value maintained in the selector registers associated with each of the individual delay stages may be the same values.

Delay lock loop circuit 200 includes a set of delay stages 242, 244, 246, 248, 250 corresponding to delay stages 142, 144, 146, 148, 150. Each of delay stages 242, 244, 246, 248, 250 includes a plurality of selectable delay elements and a selector register. The selector register maintains a value that is used to select the number of selectable delay elements that are used in forming a particular delay implemented by the delay stage. Delay stage 242 provides a stage output 243 (i.e., strobe0dly 172), delay stage 244 provides a stage output 245 (i.e., strobe1dly 174), delay stage 246 provides a stage output 247 (i.e., strobe2dly 176), delay stage 248 provides a stage output 249 (i.e., strobe0dly 178), and delay stage 250 provides a stage output 251 (i.e., strobe0dly 180). As shown, in the master mode discussed in relation to FIG. 1, reference input 108 is provided as an input to delay stage 242, stage output 243 is provided as an input to delay stage 244, stage output 245 is provided as an input to delay stage 246, stage output 247 is provided as an input to delay stage 248, and stage output 249 is provided as an input to delay stage 250.

Further, delay lock loop circuit 200 includes a feedback loop corresponding to feedback loop 122 that includes a phase comparator 210. Delay lock loop circuit 200 also includes a phase selector multiplexer 252. In one embodiment of the present invention, each of the aforementioned delay stages is designed to implement a phase delay of about seventy-two degrees. In such cases, phase selector multiplexer 252 provides an ability to select between a one stage seventy-two degree phase shift or a one stage ninety degree phase shift depending upon whether a selector input 253 is set such that phase selector multiplexer 252 causes stage output 249 or stage output 251 to drive a multiplexer output 254. Based on the disclosure provided herein, one of ordinary skill in the art will recognize a variety of embodiments that do not employ a multiplexer 252, or that employ additional multiplexers to allow for selection of different stage outputs.

Reference signal 108, stage output 245, and one of stage output 249 or stage output 251 are provided to an up/down generator 216 of phase comparator 210. Up/down generator 216 provides an output to an increment generator 214 that indicates whether a number of delay elements used in each of delay stages 242, 244, 246, 248, 250 should be incremented, decremented or maintained constant to achieve the desired phase shift. Increment generator 214 provides an output to a lock generator 212 that provides a lock output 213 that is asserted whenever delay lock loop circuit 200 is operating at or near a desired delay.

In addition, increment generator 214 provides an increment/decrement signal 215 to each of the selector registers implemented as part of delay stages 242, 244, 246, 248, 250. Depending upon the assertion level of increment/decrement signal 215, the value maintained in the respective selector registers is increased or decreased. This increase or decrease in the value maintained in the respective selector registers causes a corresponding increase or decrease in the amount of delay incurred when a signal is passed through the associated delay stage.

A selector register enable circuit 230 provides a group of selector register enable signals 231 that are distributed to each of the respective delay stages 242, 244, 246, 248, 250. The selector registers implemented as part of delay stages are each enabled by one of selector register enable signals 231 that is synchronized to an output from the particular delay stage. In this way, glitches are avoided when the value of the respective selector registers are updated.

It should be noted that the aforementioned delay width and register width is related to a particular implementation. It should also be noted that in contrast to the preceding example, the width of the selector registers implemented as part of delay stages 242, 244, 246, 248, 250 230 need not necessarily match the number of delay elements implemented in each of delay stages 242, 244, 246, 248, 250. Further, it should be noted that each of delay stages 242, 244, 246, 248, 250 do not necessarily need to include the same number of delay elements. Based on the disclosure provided herein, one of ordinary skill in the art will recognize a number of different delay widths and register widths that may be used in accordance with different embodiments of the present invention.

Figure 2B:
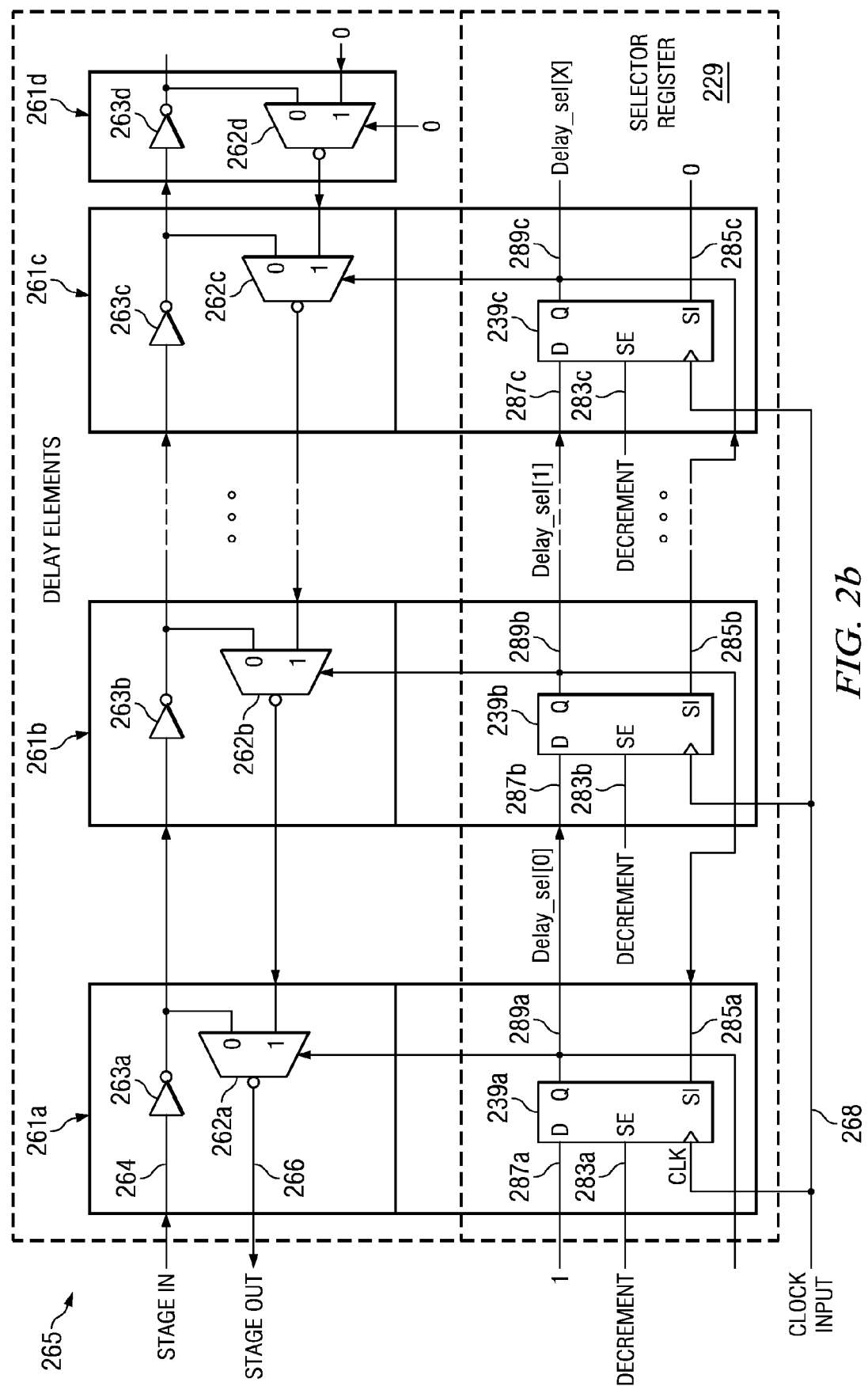

Turning to FIG. 2b, a detailed schematic of one implementation of a delay stage 265 is provided. As shown, delay stage 265 includes a set of delay elements 260 and a selector register 229. Delay stage 265 may be used in place of any or all of delay stages 242, 244, 246, 248, 250 discussed above in relation to FIG. 2a. As shown, delay stage 265 includes a number of delay elements 261 that can be configured as a chain of delay elements including as many as one delay element up to the total number of delay elements. The number of delay elements used depends upon the value maintained in selector register 229. Delay stage 265 receives a stage input 264 and provides a stage output 266. As an example, where delay stage 265 is used in place of delay stage 242, stage input 264 corresponds to reference signal 108 and stage output 266 corresponds to stage output 243. The increment input to selector register 229 corresponds to increment/decrement signal 215.

Each delay element 261 includes a delay buffer 263 that may be, but is not limited to an inverting buffer, a logic gate, or a non-inverting buffer. Based on the disclosure provided herein, one of ordinary skill in the art will recognize a variety of circuits that may be used to cause a signal delay. In addition, each delay element 261 includes a multiplexer 262 that is controlled by an input from selector register 231 and is used to control whether the signal is turned around at the particular delay element in delay stage 265. In particular, when the value provided from selector register 231 is a logic '1', the signal will not turn around, and in turn will select the signal from the next delay element. In contrast, when the value provided from selector register 231 is a logic '0', the signal turns around at that delay element. As each delay element 261 drives a subsequent delay element 261 (i.e., the output of delay element 261d, drives the output of delay element 261c), the value provided from selector register 231 includes a series of logic '1's followed by a series of logic '0's, with the transition between logic '0's and logic '1's being positioned such that it corresponds to the overall delay line length implemented in delay stage 265.

Selector register 229 is implemented as a shift register that causes a series of logic '1's followed by a series of logic '0's to shift right whenever the delay implemented by delay stage 261 is to be increased, and to shift left whenever the delay implemented by delay stage 261 is to be decreased. In particular, selector register 229 includes a number of flip-flops 239 configured in series. Each of flip-flops 239 includes a shift enable input 283, a scan input 285, a data input 287 and an output 289. In operation, when a shift right is to occur, an increment signal input (e.g., increment/decrement signal 215) is asserted high, and upon the next assertion of a clock input 268 (e.g., one of enable signals 231 associated with delay stage 265 gated with stage output 265 discussed below in relation to FIG. 2c) the block of logic '1's followed by the block of logic '0's shifts right. In contrast, when a shift left is to occur, the increment signal input (e.g., increment/decrement signal 215) is asserted low, and upon the next assertion of a clock input (e.g., one of enable signals 231 associated with delay stage 265 gated with stage output 265 discussed below in relation to FIG. 2c) the block of logic '1's followed by the block of logic '0's shifts left. Based on the disclosure provided herein, one of ordinary skill in the art will recognize other designs for implementing selector register 229.

Figure 2C:
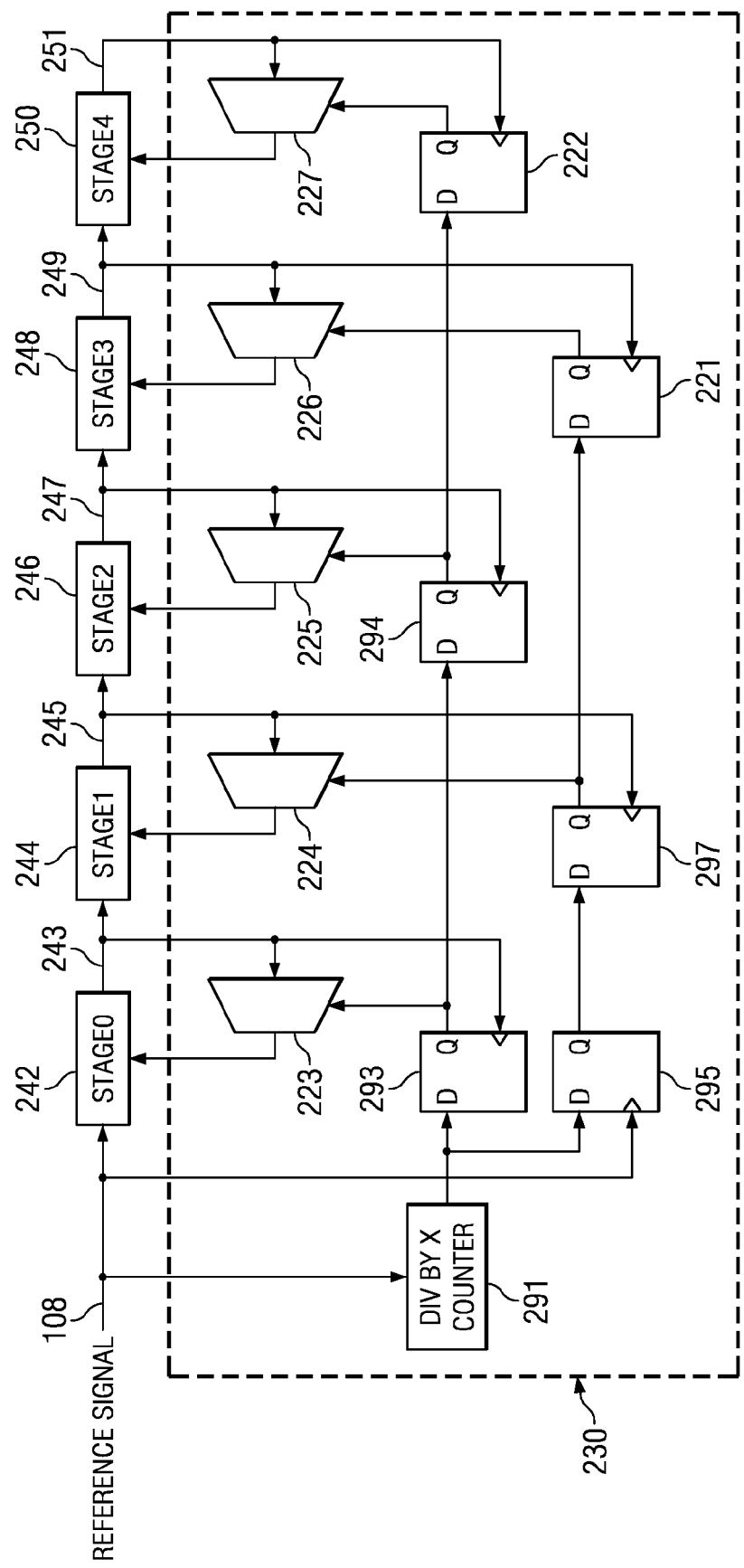

Turning to FIG. 2c, a detailed diagram of selector register enable circuit 230 is shown in relation to delay stages 242, 244, 246, 248, 250. As shown, selector register enable circuit 230 includes a counter 291 that asserts each time a particular number of cycles of reference signal 108 have been received. In one particular case, counter 291 is designed such that its output asserts each time six cycles of reference signal 108 have been received.

The output of counter 291 is applied to the data input of a flip-flop 293 where it is registered synchronous to stage output 243 (i.e., stage output 243 is applied to the clock input of flip-flop 293). The output of flip-flop 293 is provided to delay stage 242 via a clock gate 223. Clock gate 223 operates to gate stage output 243 with the output of flip-flop 293, with the output of clock gate 223 being used as the clock input to the selector register associated with delay stage 242. This effectively synchronizes the clock used to update the selector register associated with delay stage 242 to the output created by the same delay stage. In this way, glitches occurring in delay stage 242 that are associated with an update of the selector register are reduced or eliminated.

A similar approach is applied to the creation of other enables 231 applied to other selector registers by selector register enable circuit 230. In particular, the output of counter 291 is registered synchronous to reference signal 108 using a flip-flop 295, and the output of register 295 is again registered using a flip-flop 297 synchronous to stage output 245. The output of flip-flop 297 is provided to delay stage 244 via a clock gate 224. Clock gate 224 operates to gate stage output 245 with the output of flip-flop 297, with the output of clock gate 224 being used as the clock input to the selector register associated with delay stage 244. This effectively synchronizes the clock used to update the selector register associated with delay stage 244 to the output created by the same delay stage. The output of flip-flop 293 is registered by flip-flop 299 synchronous to stage output 247. The output of flip-flop 299 is provided to delay stage 246 via a clock gate 225. Clock gate 225 operates to gate stage output 247 with the output of flip-flop 299, with the output of clock gate 225 being used as the clock input to the selector register associated with delay stage 246. This effectively synchronizes the clock used to update the selector register associated with delay stage 246 to the output created by the same delay stage. The output of flip-flop 299 is registered by flip-flop 222 synchronous to stage output 251. The output of flip-flop 222 is provided to delay stage 250 via a clock gate 227. Clock gate 227 operates to gate stage output 251 with the output of flip-flop 222, with the output of clock gate 227 being used as the clock input to the selector register associated with delay stage 250. This effectively synchronizes the clock used to update the selector register associated with delay stage 250 to the output created by the same delay stage. The output of flip-flop 297 is registered by flip-flop 221 synchronous to stage output 249. The output of flip-flop 221 is provided to delay stage 248 via a clock gate 226. Clock gate 226 operates to gate stage output 249 with the output of flip-flop 221, with the output of clock gate 226 being used as the clock input to the selector register associated with delay stage 248. This effectively synchronizes the clock used to update the selector register associated with delay stage 248 to the output created by the same delay stage. Again, by synchronizing an update of the selector register with a signal synchronous to the output of the delay stage with which the synchronizing register is associated any glitching may be reduced or eliminated.

Turning to FIG. 2d, a timing diagram 204 shows the relationship of reference signal 108 with the various stage outputs, enable signals, and selector register clocks. In particular, stage output 243 is shown as a delayed version of reference signal 108, with the delay corresponding to the number of delay elements utilized in delay stage 242. Stage output 245 is shown as a delayed version of stage output 243, with the delay corresponding to the number of delay elements utilized in delay stage 244. Stage output 247 is shown as a delayed version of stage output 245, with the delay corresponding to the number of delay elements utilized in delay stage 246. Stage output 249 is shown as a delayed version of stage output 247, with the delay corresponding to the number of delay elements utilized in delay stage 248. Stage output 251 is shown as a delayed version of stage output 249, with the delay corresponding to the number of delay elements utilized in delay stage 250.

The output of counter 291 is shown as asserting once for every six cycles of reference signal 108. The output of counter 291 is registered as enable 293 (i.e., the output of flip-flop 293) upon the falling edge of stage output 243. This signal is then gated with stage output 243 to create the clock input of the select register associated with delay stage 242. The clocks provided to the other delay stages are similarly generated.

Figure 2E:
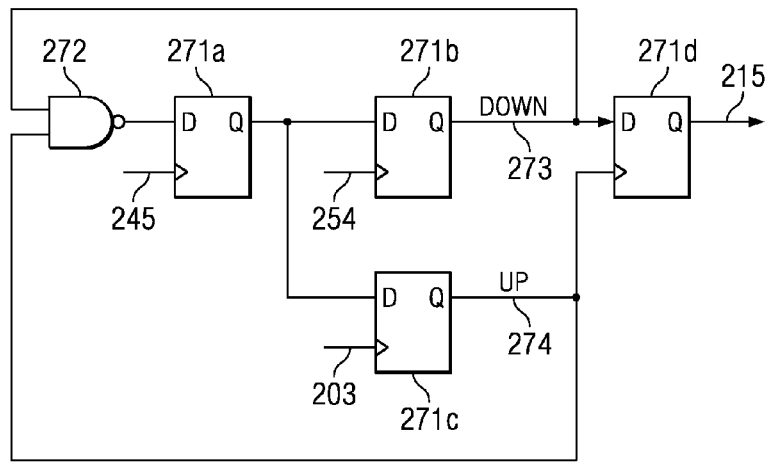

Turning to FIG. 2e, an exemplary up/down and increment generator circuit 270 that may be used in relation to one or more embodiments of the present invention is depicted. Up/down and increment generator circuit 270 may be used in place of up/down generator 216 and increment generator 214 discussed above in relation to FIG. 2a. Up/down and increment generator circuit 270 includes a number of flip-flops 271 that are each clocked using different outputs and inputs from delay stages 242, 244, 246, 248, 250. In particular, a flip-flop 271a is clocked by stage output 245, a flip-flop 271b is clocked by multiplexer output 254 that is either stage output 249 or stage output 251, and a flip-flop 271c is clocked by gated reference signal 203. A flip-flop 271d is clocked by the output of flip-flop 271c. The data input of both flip-flop 271b and flip-flop 271c are connected to the output of flip-flop 271a. The output of flip-flop 271b (i.e., a down signal 273) and the output of flip-flop 271c (i.e., an up signal 274) are applied as inputs to a NAND gate 272, and the output of NAND gate 272 is applied to the input of flip-flop 271a. The output of flip-flop 271b is also applied to the input of flip-flop 271d. The output of flip-flop 271d is increment/decrement signal 215.

Figure 2F:
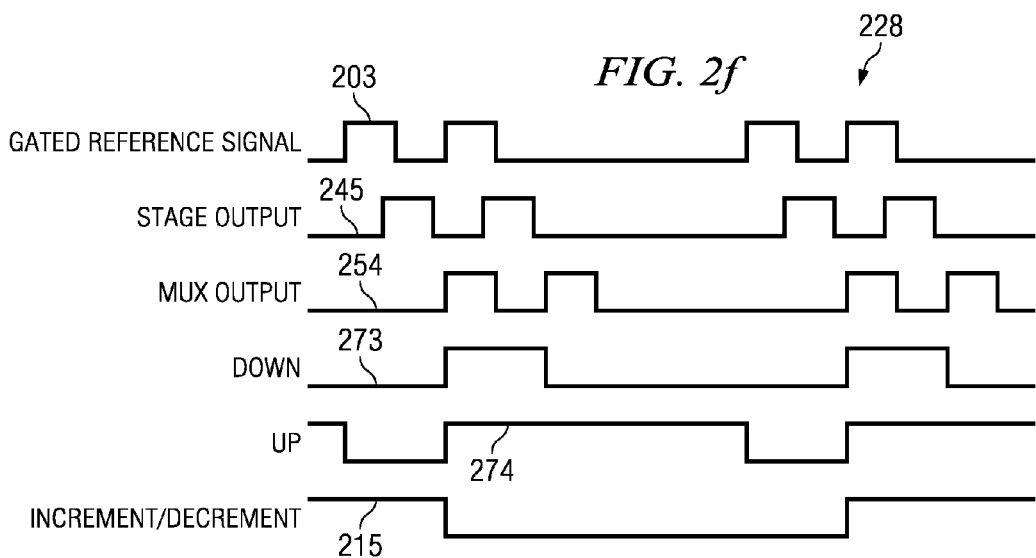

Operation of up/down and increment generator circuit 270 is described in relation to a timing diagram 228 of FIG. 2f. As shown, gated reference signal 203 is a gated version of a clock signal with two out of every four clock cycles gated out by reference signal gate 202. Gated reference signal 203 is passed through delay stage 242 and delay stage 244 to create stage output 245. Multiplexer output 254 is gated reference signal 203 after it has been passed through delay stage 242, delay stage 244, delay stage 246, delay stage 248 and in some cases delay stage 250 depending upon the assertion of selector input as discussed above in relation to FIG. 2a. As shown, up signal 274 and down signal 273 are originally asserted at a logic '0'. Upon the next positive transition of stage output 245, the output of flip-flop 271a transitions to a logic '1'. Then, upon the next positive transition of gated reference clock 203, up signal 274 transitions to a logic '1', and upon the next positive transition of multiplexer output 254, down signal 273 transitions to a logic '1'. Where up signal 274 transitions before down signal 273, increment/decrement signal 215 is asserted as a logic '0'. In contrast, where up signal 274 transitions after down signal 273, increment/decrement signal 215 is asserted as a logic '1'. In this way, a signal indicating whether the value in selector register 230 may be incremented or decremented based on a comparison of a phase shifted version of a reference clock with the reference clock. It should be noted that up/down and increment generator circuit 270 is merely exemplary, and that one of ordinary skill in the art will recognize other up/down circuits that may be used in relation to various embodiments of the present invention.

It should be noted that such glitch reduction circuitry may not be included in various embodiments of the present invention. Rather, some embodiments of the present invention may utilize a delay lock loop circuit that does not include the aforementioned glitch reduction circuitry.

Turning to FIG. 3, an exemplary slave configured delay circuit 300 representing operation of the delay lock loop circuit of FIG. 1a when operated in slave mode reusing the circuits of delay lock loop circuit 200 in accordance with some embodiments of the present invention is shown. Slave configured delay circuit 300 is effectively delay lock loop circuit 200 disaggregated into individual slave stages. By doing this, each of delay stages 242, 244, 246, 248, 250 may be used in a delay lock loop circuit to establish a number of delay elements in each of the stages to produce a lock condition. Once locked, the delay stages may be reused to delay individual signals by an amount that corresponds to the delay of each stage that was established when operating in the master mode. This results in, among other things, a savings in circuit area. The process of locking may be repeated occasionally by switching the circuit back to a master mode, and once locked the circuit may be switched back to a slave mode.

As shown, slave configured delay circuit 300 includes delay stages 242, 244, 246, 248, 250 each disconnected from each other and used to apply a delay to a respective strobe signal. The amount of delay applied is controlled by selector registers implemented as part of delay stages 242, 244, 246, 248, 250 and described above in relation to FIGS. 2a-2b. The value maintained in each of the selector registers corresponds to the value established during a master mode operation. This value may be the same as that established during master mode operation, or may be, for example, a multiple of the value established during master mode operation.

Turning to FIGS. 4a-4e, another exemplary delay lock loop circuit 400 representing operation of the delay lock loop circuit of FIG. 1a when operated in master mode in accordance with some embodiments of the present invention is shown. It should be noted that exemplary delay lock loop circuit 400 includes a single selector register that controls the number of delay elements utilized in each of the delay stages similar to that described in relation to FIG. 1a above.

Delay lock loop circuit 400 includes a set of delay stages 442, 444, 446, 448, 450. Further, delay lock loop circuit 400 includes a feedback loop that includes a phase comparator 410, an enable generator 420, and a unified selector register 430. Delay lock loop circuit 400 also includes a reference signal gate 402, and a phase selector multiplexer 452. In one particular embodiment of the present invention, each of the aforementioned delay stages is designed to implement a phase delay of about eighteen degrees. In such cases, phase selector multiplexer 452 provides an ability to select between an overall seventy-two degree phase shift or an overall ninety degree phase shift depending upon whether a selector input 453 is set such that phase selector multiplexer 452 causes stage output 449 or stage output 451 to drive a multiplexer output 454. Based on the disclosure provided herein, one of ordinary skill in the art will recognize a variety of embodiments that do not employ a multiplexer 452, or that employ additional multiplexers to allow for selection of different stage outputs.

Reference signal gate 402 receives a reference signal 108 and provides a gated reference signal 403. In one particular embodiment of the present invention includes an AND gate that ANDs an inverted version of gate control output 422 with reference signal 108. In some cases, circuitry is included that controls the timing of gate control output such that producing gated reference signal 403 from reference signal 108 does not result in glitches on gated reference signal 403. Delay stage 442 receives gated reference signal 403, and provides a stage output 443 (i.e., strobe0dly 172). Stage output 443 is gated reference signal 403 delayed by a determined amount. Delay stage 444 receives stage output 443, and provides a stage output 445 (i.e., strobe1dly 174). Stage output 445 is stage output 443 delayed by a determined amount. Delay stage 446 receives stage output 445, and provides a stage output 447 (i.e., strobe2dly 176). Stage output 447 is stage output 445 delayed by a determined amount. Delay stage 448 receives stage output 447, and provides a stage output 449 (i.e., strobe3dly 178). Stage output 449 is stage output 447 delayed by a determined amount. Delay stage 450 receives stage output 449, and provides a stage output 451 (i.e., strobe4dly 180). Stage output 451 is stage output 449 delayed by a determined amount. Each of delay stages 442, 444, 446, 448, 450 includes a number of delay elements that may be selectably incorporated in a delay chain.

Gated reference signal 403, stage output 445, and one of stage output 449 or stage output 451 are provided to an up/down generator 416 of phase comparator 410. Up/down generator 416 provides an output to an increment generator 414 that indicates whether a number of delay elements used in each of delay stages 442, 444, 446, 448, 450 should be incremented, decremented or maintained constant to achieve the desired phase shift. Increment generator 414 provides an output to a lock generator 212 that provides a lock output 413.

In addition, increment generator 414 provides an increment/decrement signal 415 to an enable generator 420. Enable generator 420 controls the modification of a unified selector register 430 via a set of control signals 421. In one particular embodiment of the present invention, control signals 421 includes an enable signal and an increment/decrement signal. In such a case when the increment/decrement signal indicates an increment and the enable signal is asserted, the value maintained in unified selector register 430 is incremented. Alternatively, when the increment/decrement signal indicates a decrement and the enable signal is asserted, the value maintained in unified selector register 430 is decremented. In such an embodiment, a lock condition may be indicated (i.e., lock output 413 is asserted) when the value in selector register is to be maintained constant. In such cases, the enable signal is not asserted when the lock condition is indicated.

In some embodiments of the present invention, enable generator 420 includes a counter circuit that is synchronized to reference signal 108. The counter circuit periodically asserts an enable signal (part of control signals 421). In one particular embodiment of the present invention, the counter circuit asserts the enable signal once for every four cycles of reference signal 108 when the lock condition has not been established. In such a case, a gate control output 422 derived from the counter may be provided to reference signal gate 402 such that gated reference signal 403 does not assert when the enable of control signals 421 is asserted. In this way, glitches are avoided when the value in unified selector register 430 is updated.

An X-bit selector value 432 maintained in unified selector register 430 is provided to each of delay stages 442, 444, 446, 448, 450. In operation, X-bit selector value 432 selects the number of the delay elements in each of delay stages 442, 444, 446, 448, 450 that are used in a delay chain implemented by the respective delay stage. In one particular embodiment of the present invention, X-bit selector register is sixty-three bits wide, and the number of selectable delay elements in each of delay stages 442, 444, 446, 448, 450 is also sixty-three. It should be noted that the aforementioned delay width and register width is related to a particular implementation. It should also be noted that in contrast to the preceding example, the width of unified selector register 430 need not necessarily match the number of delay elements implemented in each of delay stages 442, 444, 446, 448, 450. Further, it should be noted that each of delay stages 442, 444, 446, 448, 450 do not necessarily need to include the same number of delay elements. Based on the disclosure provided herein, one of ordinary skill in the art will recognize a number of different delay widths and register widths that may be used in accordance with different embodiments of the present invention.

Operation of delay lock loop circuit 400 is described in relation to a timing diagram 495 of FIG. 4b. Turning to FIG. 4b, reference signal 108 is shown as a repeating clock with approximately a fifty percent duty cycle. As shown, enable generator 420 asserts gate control output 422 once every four cycles of reference signal 108. Reference signal gate 402 gates reference signal 108 with gate control output 422 to produce gated reference signal 403. In this example, gate control output 422 and the enable that is part of signals 421 have the same characteristics. In particular, gated reference signal 403 is reference signal 108 that is not asserted whenever gate control output 422 is asserted.

Whenever the value in unified selector register 430 is to be incremented, increment generator 414 asserts increment/decrement signal 415 to indicate an increment operation (e.g., a logic '1' in this example). Alternatively, whenever the value in unified selector register 430 is to be decremented, increment generator 414 asserts increment/decrement signal 415 to indicate a decrement operation (e.g., a logic '0' in this example). Increment/decrement signal 415 is re-clocked by enable generator 420 as increment signal (part of signals 421). Signals 421 are passed by enable generator 420 to unified selector register 430 where they cause either an increment or decrement of X-bit value 432 upon the next positive edge of reference signal 108. As previously stated, X-bit value 432 causes a change in the number of delay elements utilized in delay stages 442, 444, 446, 448, 450 (i.e., a change in the delay incurred through each of the respective delay stages).

Figure 4A:
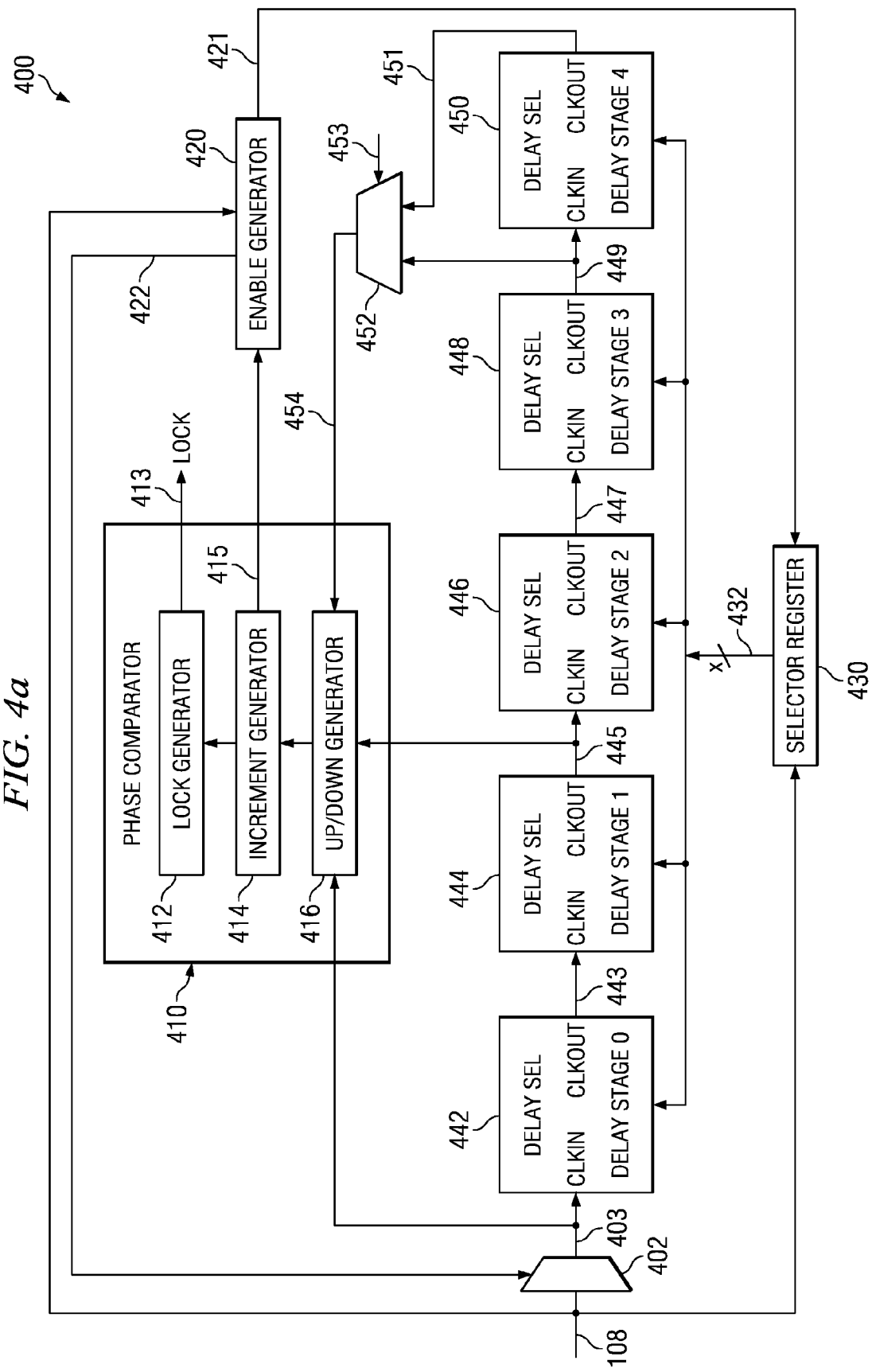
Figure 4C:
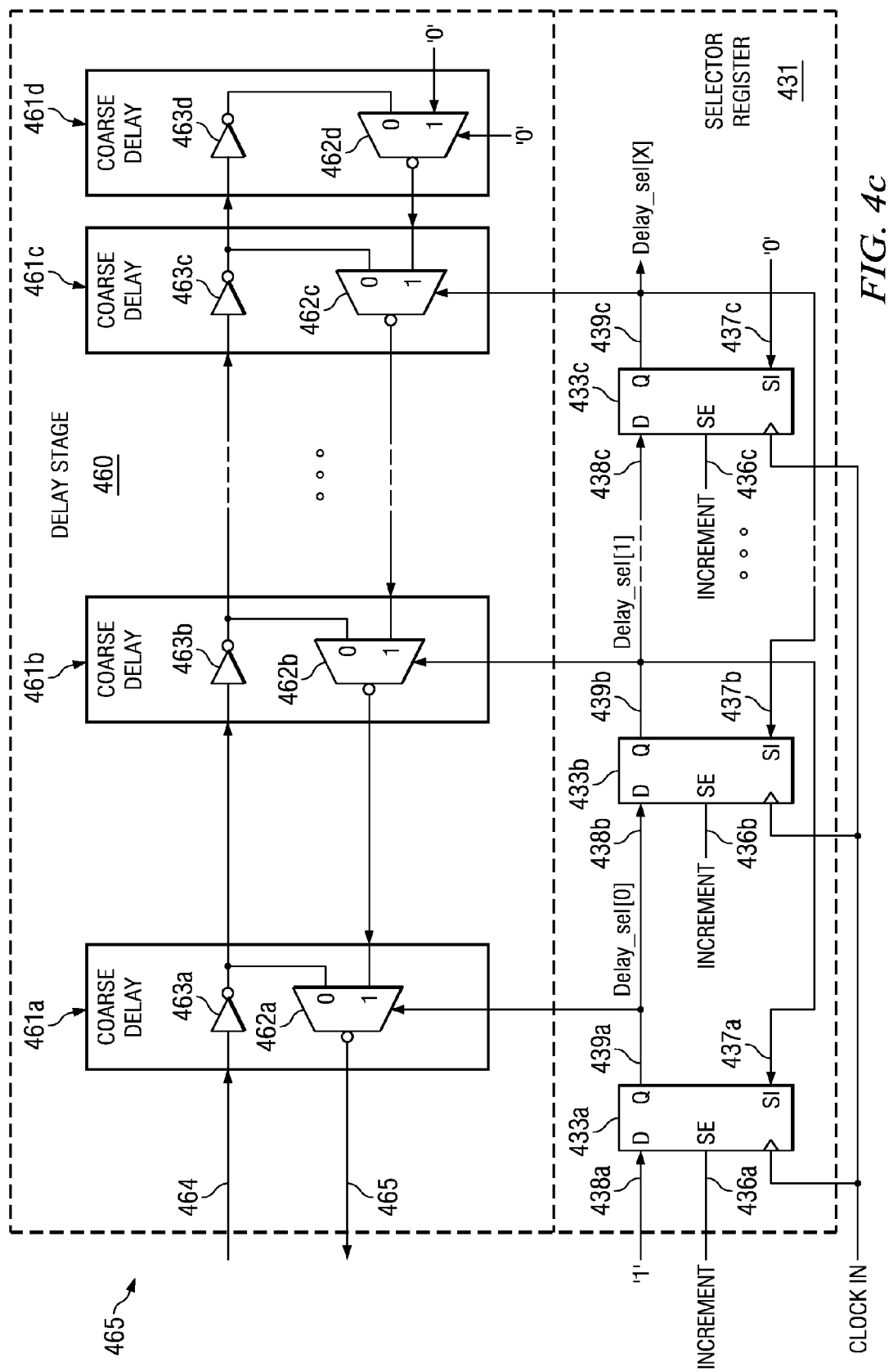

Turning to FIG. 4c, a detailed schematic of one implementation of a delay stage 460 and a selector register 431 is shown. Delay stage 460 may be used in place of any or all of delay stages 442, 444, 446, 448, 450 discussed above in relation to FIG. 4a. Similarly, selector register 431 may be used in place of selector register 432 discussed above in relation to FIG. 4a. As shown, delay stage 460 includes a number of delay elements 461 that can be configured as a chain of delay elements including one delay element up to the total number of delay elements depending upon the value maintained in selector register 431. Delay stage 460 receives an input signal 464 and provides an output signal 465. As an example, where delay stage 460 is used in place of delay stage 442, input signal 464 corresponds to gated reference signal 403 and output signal 465 corresponds to stage output 443. Similarly, inputs from selector register 431 correspond to X-bit value 432.

Each delay element 461 includes a delay buffer 463 that may be, but is not limited to an inverting buffer, a logic gate, or a non-inverting buffer. Based on the disclosure provided herein, one of ordinary skill in the art will recognize a variety of circuits that may be used to cause a signal delay. In addition, each delay element 461 includes a multiplexer 462 that is controlled by an input from selector register 431 and is used to control whether the particular delay element is included in an overall delay chain implemented by delay stage 460. In particular, when the value provided from selector register 431 is a logic '1', the particular delay element is not selected. In contrast, when the value provided from selector register 431 is a logic '0', the particular delay element is selected. As each delay element 461 drives a subsequent delay element 461 (i.e., the output of delay element 461d, drives the output of delay element 461c), the value provided from selector register 431 includes a series of logic '1's followed by a series of logic '0's, with the transition between logic '0's and logic '1's being positioned such that it corresponds to the overall delay line length implemented in delay stage 460.

Selector register 431 is implemented as a shift register that causes a series of logic '1's followed by a series of logic '0's to shift right whenever the delay implemented by delay stage 461 is to be increased, and to shift left whenever the delay implemented by delay stage 461 is to be decreased. In particular, selector register 431 includes a number of flip-flops 433 configured in series. Each of flip-flops 433 includes a shift enable input 436, a scan input 237, a data input 438 and an output 439. In operation, when a shift right is to occur, an increment signal input (e.g., part of signals 421) is asserted high, and upon the next assertion of a clock input (e.g., reference input 108) the block of logic '1's followed by the block of logic '0's shifts right. In contrast, when a shift left is to occur, the increment signal input (e.g., part of signals 421) is asserted low, and upon the next assertion of a clock input (e.g., reference input 108) the block of logic '1's followed by the block of logic '0's shifts left. In some cases, an additional enable signal may be added to each of flip-flops 433 that enables both right and left shifting. Based on the disclosure provided herein, one of ordinary skill in the art will recognize other designs for implementing selector register 431.

Figure 4D:
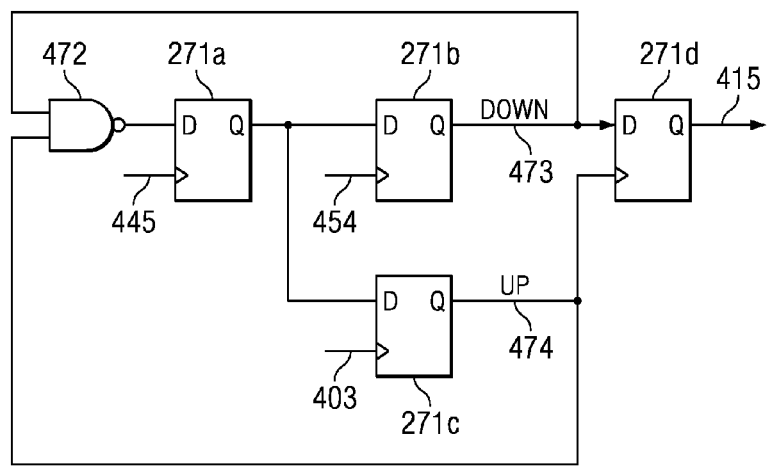
Figure 4E:
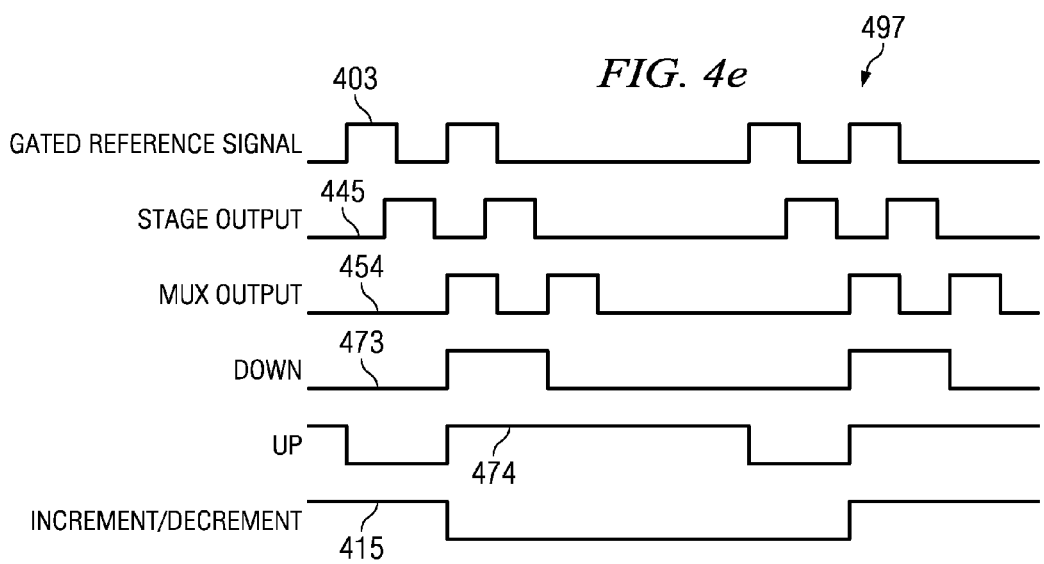

Turning to FIG. 4d, an exemplary up/down and increment generator circuit 470 that may be used in relation to one or more embodiments of the present invention is depicted. Up/down and increment generator circuit 470 may be used in place of up/down generator 416 and increment generator 414 discussed above in relation to FIG. 4a. Up/down and increment generator circuit 470 includes a number of flip-flops 471 that are each clocked using different outputs and inputs from delay stages 442, 444, 446, 448, 450. In particular, a flip-flop 471a is clocked by stage output 445, a flip-flop 471b is clocked by multiplexer output 454 that is either stage output 449 or stage output 451, and a flip-flop 471c is clocked by gated reference signal 403. A flip-flop 471d is clocked by the output of flip-flop 471c. The data input of both flip-flop 471b and flip-flop 471c are connected to the output of flip-flop 471a. The output of flip-flop 471b (i.e., a down signal 474) and the output of flip-flop 471c (i.e., an up signal 274) are applied as inputs to a NAND gate 472, and the output of NAND gate 472 is applied to the input of flip-flop 471a. The output of flip-flop 471b is also applied to the input of flip-flop 471d. The output of flip-flop 471d is increment/decrement signal 415.

Operation of up/down and increment generator circuit 470 is described in relation to a timing diagram 497 of FIG. 4b. As shown, gated reference signal 403 is a gated version of a clock signal with two out of every four clock cycles gated out by reference signal gate 402. Gated reference signal 403 is passed through delay stage 442 and delay stage 444 to create stage output 445. Multiplexer output 454 is gated reference signal 403 after it has been passed through delay stage 442, delay stage 444, delay stage 446, delay stage 448 and in some cases delay stage 450 depending upon the assertion of selector input as discussed above in relation to FIG. 4a. As shown, up signal 274 and down signal 474 are originally asserted at a logic '0'. Upon the next positive transition of stage output 445, the output of flip-flop 471a transitions to a logic '1'. Then, upon the next positive transition of gated reference clock 403, up signal 274 transitions to a logic '1', and upon the next positive transition of multiplexer output 454, down signal 474 transitions to a logic '1'. Where up signal 274 transitions before down signal 474, increment/decrement signal 415 is asserted as a logic '0'. In contrast, where up signal 274 transitions after down signal 474, increment/decrement signal 415 is asserted as a logic '1'. In this way, a signal indicating whether the value in unified selector register 430 may be incremented or decremented based on a comparison of a phase shifted version of a reference clock with the reference clock. It should be noted that up/down and increment generator circuit 470 is merely exemplary, and that one of ordinary skill in the art will recognize other up/down circuits that may be used in relation to various embodiments of the present invention.

Turning to FIG. 5, another exemplary slave configured delay circuit 500 representing operation of the delay lock loop circuit of FIG. 1a when operated in slave mode reusing the circuits of delay lock loop circuit 400 in accordance with some embodiments of the present invention is shown. Slave configured delay circuit 500 is effectively delay lock loop circuit 400 disaggregated into individual slave stages. By doing this, each of delay stages 442, 444, 446, 448, 450 may be used in a delay lock loop circuit to establish a number of delay elements in each of the stages to produce a lock condition. Once locked, the delay stages may be reused to delay individual signals by an amount that corresponds to the delay of each stage that was established when operating in the master mode. This results in, among other things, a savings in circuit area. The process of locking may be repeated occasionally by switching the circuit back to a master mode, and once locked the circuit may be switched back to a slave mode.

As shown, slave configured delay circuit 500 includes delay stages 442, 444, 446, 448, 450 each disconnected from each other and used to apply a delay to a respective strobe signal. The amount of delay applied is controlled by selector register 430 as described above in relation to FIGS. 4a-4b. In particular, the value established in selector register 430 during master mode operation is maintained and used to control the number of delay elements implemented in each of delay stages 442, 444, 446, 448, 450 during slave mode operation.

Turning to FIG. 6, a flow diagram 600 depicts a method for implementing signal delay in accordance with various embodiments of the present invention. Flow diagram 600 is described in relation to master/slave delay lock loop circuit 101, but it should be noted that other delay lock loop circuits may be used in relation to the methods discussed in relation to flow diagram 600. Following flow diagram 600, operation in master mode is enabled (block 610). This includes asserting master slave select 112 such that reference signal 108 drives delay stage 142, and an input of each of the subsequent delay stages 144, 146, 148, 150 is driven by the output of the preceding delay stage. In this configuration, feedback loop 122 operates to compare two or more signal phases, and to increment or decrement the number of delay elements utilized in each of delay stages 142, 144, 146, 148, 150 to adjust the compared signal until a desired phase delay is provided at the output (block 620). This process continues until a lock condition is achieved (block 630). Such a lock condition occurs when the desired delay condition is achieved as indicated by feedback loop 122.

Once a lock condition is achieved (block 630), the delay lock loop circuit is reconfigured for operation in the slave mode (block 640). This includes asserting master slave select 112 such that a respective strobe signal drives the input of each of delay stages 142, 144, 146, 148, 150. In this configuration, feedback loop 122 is disabled, and the value in selector register 140 that was established during operation in the master mode is maintained constant. The value in selector register 140 corresponds to the delay incurred by a respective strobe signal passing through the associated delay stage.

In some cases, it may be desirable to occasionally recalibrate the delay (block 650). Where this is not currently desired, the individual delay stages continue to operate separately in delaying their respective strobe signals (block 660). Alternatively, where a recalibration is desired (block 650), master operation is again enabled and the number maintained in selector register 140 may again be modified to establish a lock condition (block 620). Once the lock condition is reestablished (block 650), the circuit may be switched back to operation in the slave mode. As just one of many advantages, such operation allows for reuse of delay circuitry used in master operation to delay individual signals in the slave mode.

In conclusion, the present invention provides novel systems, devices, methods for providing signal delays. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A delay lock loop circuit, the circuit comprising:
   at least a first delay stage and a second delay stage, wherein each of the first delay stage and the second delay stage includes a plurality of selectable delay elements, wherein an input of the first delay stage is selectably driven by one of a first signal and a reference signal, wherein the first delay stage provides a first stage output, wherein an input of the second delay stage is selectably driven by one of a second signal and the first stage output, and wherein the second delay stage provides a second stage output;
   a mode signal, wherein:
      a first state of the mode signal causes the first signal to drive the first delay stage and the second signal to drive the second delay stage; and
      a second state of the mode selection signal causes the reference signal to drive the first delay stage and the first stage output to drive the second delay stage; and
   a feedback loop, wherein the reference signal and a derivative of the second stage output are provided as inputs to the feedback loop, wherein the feedback loop is operable at least when the mode signal is in the second state to determine a program number corresponding to a number of the plurality of selectable delay elements utilized in the first delay stage and the second delay stage to delay the derivative of the second stage output relative to the reference signal; and
   a selection register, wherein the selection register is communicably coupled to both the first delay stage and the second delay stage, wherein a value stored in the selection register corresponds to the program number, and wherein the value determines the number of the plurality of selectable delay elements utilized to delay the first stage output relative to the input of the first delay stage, and to delay the second stage output relative to the input of the second stage,
   wherein the circuit further comprises:
   a third delay stage, a fourth delay stage and a fifth delay stage, wherein each of the third delay stage, the fourth delay stage and the fifth delay stage includes the plurality of selectable delay elements;
   wherein an input of the third delay stage is selectably driven by one of a third signal and the second stage output, wherein the third delay stage provides a third stage output, wherein an input of the fourth delay stage is selectably driven by one of a fourth signal and the third stage output, wherein the fourth delay stage provides a fourth stage output, wherein an input of the fifth delay stage is selectably driven by one of a fifth signal and the fourth stage output, and wherein the fifth delay stage provides a fifth stage output;
   wherein the selection register is further communicably coupled to the third delay stage, the fourth delay stage and the fifth delay stage; and wherein the program number determines the number of the plurality of selectable delay elements utilized to delay the third stage output relative to the input of the third delay stage, to delay the fourth stage output relative to the input of the fourth stage, and to delay the fifth stage output relative to the input of the fifth stage.

2. The circuit of claim 1, wherein:
   a first state of the mode signal further causes the third signal to drive the third delay stage, the fourth signal to drive the fourth delay stage, and the fifth signal to drive the fifth delay stage; and
   a second state of the mode selection signal further causes the second stage output to drive the third delay stage, the third stage output to drive the fourth stage, and the fourth stage output to drive the fifth stage.

3. The circuit of claim 1, wherein the first signal and the reference signal are applied to a first multiplexer, wherein an output of the first multiplexer is applied to the first delay stage, wherein the second signal and the first stage output are applied to a second multiplexer, and wherein an output of the second multiplexer is applied to the second delay stage.

4. The circuit of claim 1, wherein the plurality of delay elements is selected from a group consisting of: a plurality of single input buffers, and a plurality of multiple input logic gates.

5. A method for delay signal timing, the method comprising:
providing a delay lock loop circuit, wherein the delay lock loop circuit includes at least a first delay stage and a second delay stage, and wherein each of the first delay stage and the second delay stage includes a plurality of selectable delay elements;
operating the delay lock loop circuit in a first mode, wherein the first delay stage and the second delay stage are configured in series with a reference signal applied to an input of the first delay stage, and an output of the first delay stage is applied as an input to the second delay stage;
determining a number of the selectable delay elements that when configured in series implement a particular delay;
providing the number to both the first delay stage and the second delay stage;
operating the delay lock loop circuit in a second mode, wherein a first signal is applied to the input of the first delay stage, wherein the first delay stage provides a first output delayed relative to the first signal by an amount corresponding to the determined number of the selectable delay elements, wherein a second signal is applied to the input of the second delay stage, wherein the second delay stage provides a second output delayed relative to the second signal by an amount corresponding to the determined number of the selectable delay elements.

6. The method of claim 5, wherein the delay lock loop circuit includes an increment/decrement circuit, and wherein the increment/decrement circuit is operable to modify the number of the selectable delay elements utilized in both the first delay stage and the second delay stage.

7. The method of claim 6, wherein the delay lock loop circuit additionally includes at least a third delay stage, a fourth delay stage and a fifth delay stage; wherein each of the third delay stage, the fourth delay stage and the fifth delay stage includes the plurality of delay elements; and wherein the a number of the selectable delay elements is provided to each of the third delay stage, the fourth delay stage and the fifth delay stage.

8. The method of claim 7, wherein during operation of the delay lock loop circuit in the first mode the third delay stage, the fourth delay stage and the fifth delay stage are configured in series with an output of the second delay stage applied to an input of the third delay stage, an output of the third delay stage is applied to an input of the fourth delay stage, an output of the fourth delay stage is applied to an input of the fifth delay stage.

9. The method of claim 8, wherein during operation of the delay lock loop circuit in the first mode, the increment/decrement circuit is operable to compare the reference signal with one or both of the output of the fourth delay stage and the fifth delay stage.

10. The method of claim 5, wherein the first delay stage and the second delay stage are substantially identical.

* * * * *